United States Patent [19]

Logue

[11] Patent Number: 4,802,099

[45] Date of Patent: Jan. 31, 1989

[54] PHYSICAL PARAMETER BALANCING OF CIRCUIT ISLANDS IN INTEGRATED CIRCUIT WAFERS

[75] Inventor: Joseph C. Logue, Poughkeepsie, N.Y.

[73] Assignee: International Business Machines Corporation, Armonk, N.Y.

[21] Appl. No.: 816,093

[22] Filed: Jan. 3, 1986

[51] Int. Cl.[4] .............................................. G06F 15/60
[52] U.S. Cl. ..................................... 364/491; 307/219; 307/500; 364/488; 364/571.01
[58] Field of Search ............... 165/80.02, 80.03, 80.04, 165/80.05; 307/219, 500; 361/386; 364/488, 489, 490, 491, 550, 557, 571

[56] References Cited

U.S. PATENT DOCUMENTS

| | | | |
|---|---|---|---|
| 3,858,120 | 12/1974 | Lorteije | 330/253 |
| 3,879,839 | 4/1975 | Logue | 437/8 |
| 3,984,860 | 10/1976 | Logue | 357/68 |
| 4,034,356 | 7/1977 | Howley et al. | 340/465 |
| 4,222,090 | 9/1980 | Jaffe | 361/386 |
| 4,561,006 | 12/1985 | Currie | 357/28 |
| 4,654,752 | 3/1987 | Kyle | 361/386 |
| 4,689,658 | 8/1987 | Akasaki et al. | 361/386 X |

FOREIGN PATENT DOCUMENTS 59-88864 5/1984 Japan .

OTHER PUBLICATIONS

J. C. Logue, W. J. Kleinfelder, P. Lowy, J. R. Moulic and W-W. Wu, "Techniques for Improving Engineering Productivity of VLSI Designs", IBM Journal of Research and Development, vol. 25, Nos. 2-3, pp. 106–115, May 1981.

J. Graeme, "Electronic Thermometers", Designing with Operational Amplifiers, McGraw-Hill, NY, 1977, Section 9.5, pp. 254–257.

"Semiconductor Packaging Using Chip Mate Concept with Dual Inline Package (Dip) for Bonded Vias, Terminals and Reflowed Solder Pads and Using Chip Carrier for Reflowed Solder Pads and Bonded Terminals", by R. F. Collier, Jr., IBM Technical Disclosure Bulletin, vol. 27, No. 11, Apr. 1985, pp. 6507–6509.

"Fluid Assembly for High Speed Chip Cooling", by J. M. Eldridge & K. E. Petersen, IBM Technical Disclosure Bulletin, vol. 26, No. 2, Jul. 1983, p. 841.

Primary Examiner—Parshotam S. Lall
Assistant Examiner—Edward R. Cosimano
Attorney, Agent, or Firm—Philip J. Feig

[57] ABSTRACT

Balancing values of physical parameters such as temperature between used and unused circuit islands, in a fault bypass wafer circuit module, is done by mandating circuit exercise within each island considered critical. Within individual exercise islands, thermostats control heaters, or other physical parameter reporting means control transducers to return the physical parameter to nominal values. Heavily exercised operational islands and unexercised faulty or good redundant islands, which could develop destructive thermal gradients and resulting operational or connection failures. To eliminate such physical gradients, circuit exercise is mandated in all circuit islands which receive no ordinary circuit exercise, simply to maintain physical balance. Temperature is the physical parameter of primary concern, but physical parameters include piezoelectric effects, capacitance, inductance, magnetism, radiation effects and voltage, as well as other physical parameters which may be related or derivative. Each island of concern as a critical exercise island is equipped with physical parameter balancing means, comprising a physical parameter sensor and transducer controlled by the sensor to alter that physical parameter. The physical parameter may be measured, may be detected at a threshold, or may be calculated by interference from exercise event counts. The counts may be taken externally in a computer, or internally by configuring an event counter within the electronics of the island. An interposer and a conductive liquid for combined electrical and heat distribution are options.

26 Claims, 4 Drawing Sheets

PHYSICAL PARAMETER BALANCING OF CIRCUIT ISLANDS IN INTEGRATED CIRCUIT WAFERS

BACKGROUND OF THE INVENTION

1. Field of the Invention

This invention relates to integrated circuits, and more particularly relates to dynamically allocating circuit exercise among used and unused circuit islands on integrated circuit wafers so as to keep localized physical parameters, such as island-to-island thermal gradients, within nominal value ranges across the wafers.

2. Description of the Prior Art

The integrated circuit industry deploys a number of techniques for keeping integrated circuits comfortably protected from physical failure mechanisms, chief of which is heat. There are a number of mechanisms for keeping integrated circuit modules within operating temperatures appropriate for trouble-free operation. These include such techniques as requiring warm-up periods, providing air or liquid cooling of modules, and requiring air conditioned environments. These techniques tend to be permanent global solutions for great groups of circuit modules mounted together in gates. Attention is paid also to the heat dissipation characteristics of wafers in individual integrated circuit modules, but aside from heat sinks there is relatively little deployment of physical parameter control mechanisms below the module level, even through there may be hundreds or even thousands of circuit devices on the wafer. Current practice is to dice a round semiconductor wafer into a number of rectangular chips for mounting in modules, but the trend is toward larger, even full-wafer, chips. For purposes of this patent specification, the term "wafer" describes the block of semiconductor material upon which circuit devices are arrayed, regardless of size or shape.

The integrated circuit industry is constantly attempting to resolve the problem of yield detractors. Yield detractors in the semiconductor industry are failure mechanisms which render a wafer unsuitable for deployment in a product because one or more included circuits are inoperative or subject to malfunction. The yield of unsable wafers completed as a function of wafers started through the process is a very important parameter in measuring success in semiconductor manufacture. Typical yield detractors are: pipes in the semiconductor; defects in the insulator; defects in the photolithographic process. As the level of integration increases, through making individual circuits smaller and through making the wafer larger, the probability of a defect occurring rises. The yield diminishes. Process quality improvement may not be able to provide acceptable yields of perfect integrated circuit wafers. Fault bypass techniques may be required, so that circuit wafers may be used even though having one or more faults. Fault bypass techniques reassign operational duty from a bad circuit island to a normally redundant equivalent good circuit island.

As is known in the art of integrated circuits, the wafer may be relatively large, up to full slice of a semiconductor boule, now ranging from 50 to 100 millimeters in diameter or greater. The wafer may include a great number of circuit islands, which islands may be considered merely as groups physically located together in a locality of the wafer. The island may, for example, be a quadrant, or may be a quadrant of a quadrant, or other defined locality in a grid of localities.

The integrated circuit industry has reported a number of fault bypass techniques, in which a redundant circuit island is activated to take the operational duty from a circuit island in which a fault occurs. The circuit islands for fault bypass equivalency may be called "islands." A favored fault bypass technique is opposed complementary island replacement, in which islands of mirror symmetric circuits on facing primary and secondary wafers may take over the operational duty of their related mirror twins in case of fault. There is no physical replacement similar to a light bulb replacement; the duty is reassigned analogous to switching on a light bulb in an equivalent nearby fixture.

Wafer geography, and the fact that wafer interconnections are relatively giant as contrasted to logic circuitry, limit the number of interconnections available for wafer to wafer connection. Linear shear stresses resulting from differential thermal expansion of opposed complementary wafers may also limit wafer to wafer connections to a relatively small area of the wafer. Placing controlled collapse wafer connections at widely separated locations over the face of the wafer is subject to the problem of differential thermal expansion of the opposed complementary wafers, with resulting connection failures due to fatigue failure of one or more controlled collapse wafer connections. Also, nonplanarity of the mating surfaces may result in failure of controlled collapse solder balls to bridge the resulting gap during the reflow process.

Physical stress is a known problem, and is known to be primarily due to heat buildup as a function of circuit exercise. Temperature gradients, between islands of the same wafer, are known; normal heat dissipation techniques do not fully prevent exercise-related hot or cool circuit islands within a wafer. Much effort has been directed to cooling, including prevention by cooling of hot spots on a wafer, but very little beyond warmup has beend one to create island-to-island temperature balance and balance of other physical parameters. Physical parameters of redundant circuit islands have generally been ignored.

The following items are representative of the prior art: U.S. Pat. No. 3,879,839, Logue, Method of Manufacturing Multi-Function LSI Wafers, Apr. 29, 1975, shows an opposed complementary wafer mirror symmetric island fault replacement technique.

U.S. Pat. No. 3,984,860, Logue, Multi-Function LSI Wafers, Oct. 5, 1976, a division of U.S. Pat. No. 3,879,839, similarly shows an opposed complementary wafer mirror symmetric island fault replacement technique. Logue et al. "Techniques for Improving Engineering Productivity of VLSI Designs," IBM Journal of Research and Development, Volume 25, Nos. 2-3, May 1981, pages 107-115, shows a very large scale integration design approach based on the use of programmed logic array macros and a laser beam for rapid personalization and repairing of design errors.

These prior developments by the inventor and associates, while important, do not teach nor suggest the present invention, which electronically provides physical condition balancing between primary and secondary islands across wafers, regardless of whether the islands are good operational, good redundant or bad.

In the opposed complementary wafer island technique of fault bypass, the defective islands are relieved of duty for operational circuit exercise, not by means of a mechanical or chemical process, but by being disconnected by logic and power gates. Since the wafers are mirror symmetric, the controlled collapse wafer connections associated with each island and its mirror twin island of logic match up. Logic gates and power gates previously designed into both the primary wafer and the mirror symmetric secondary wafer are then used to reroute signals through global wiring that is mirror duplicated on each wafer to allocate logical circuit exercise to operational islands and to bypass good redundant islands as well as to bypass faulty islands.

SUMMARY OF THE INVENTION

It is the object of this invention to minimize compartmental gradients of physical parameters within integrated circuit wafers, regardless of duty assignment, whether the gradient is permanently caused by impurity in the semiconductor, by assignment as a good redundant island, or in a good operational island by dynamics of frequent or infrequent exercise as a function of input variations.

It is an object of this invention to provide individual circuit islands of juxtaposed primary and secondary wafers with temperature or other physical parameter balancing means, to balance the thermal or other physical effects of circuit exercise dynamically among all circuit islands. Each circuit island, whether a good operational circuit island, a good redundant circuit island, or a bad circuit island, is equipped to maintain dynamic thermal or other physical balance between opposed circuit islands and therefore between opposed mirror symmetrical wafers forming the module.

A more specific object of the invention is to direct the physical parameter effects of power distribution and of circuit exercise dynamically to eliminate physical parameter gradients across the wafer, or, alternatively, to optimize physical parameter gradients for best overall performance of the module or of the entire system, even at the cost of degradation or sacrifice of circuits in a particular island.

A feature of the invention is the integration of a thermal sensor (physical parameter reporting means) and a buried resistive semiconductive circuit (physical parameter transducing means) in the vicinity of each circuit island to control temperature (the physical parameter) of the island.

A feature of the invention is an interposer, also provided with means to direct circuit exercise dynamically to eliminate hot and cold spots, to interconnect primary and secondary wafers without thermal gradients.

Another feature of the invention is the use of a refractive or liquid conductor in the power distribution channels also as a heat transfer medium internal to the wafer.

An advantage of the preferred embodiment of the invention is the use of mirror symmetric circuit wafers, so as to provide easy mask generation for production, so as to provide easy understanding for the designer, so as to provide different but similar and short electrical paths, and to provide close physical relationships to functionally related islands so that exercise balancing can result in proper physical parameter conditions.

An advantage of the invention is that the physical parameter balancing technique can be used for a number of differing physical parameters. The chief physical parameter of concern is temperature, but other physical parameters subject to similar island-to-island balancing or compensation include piezoelectric effects, magnetism, inductance, capacitance, radiation, strain and voltage.

Another advantage is that relatively gross control of a physical parameter at the circuit island level can be used to control a second level, related derivative physical parameter. For example, temperature control at the circuit island level can be used to adjust $V_{eb}$.

Another advantage of the invention is that two mirror symmetric wafers, each having one or more logically bad islands, may be used without concern for thermomechanical stress failures due to unbalanced circuit exercise. Faulty wafers may be used with each other without complex redirection of circuit paths, so long as the bad islands do not face one another, an event which is both controllable and unlikely because mirror symmetric wafers are very different insofar as process events are concerned. Since global wiring is symmetrically duplicated, the duplicate wiring has the same characteristics as the original, is made by the same fabrication process and does not add loading capacitance to the signal drive circuits. Redundancy is achieved by circuit duplication in the Z dimension rather than in X and Y planes; performance approximates a nonredundant approach because the redundancy does not increase the area of the circuit within the plane, avoiding the inevitable lengthening of conductor paths accompanying additional circuit area.

Another advantage of the invention is that is provides for simple wafer interconnections, not limited to the periphery of the wafer, while minimizing risk of interconnection failure due to differential thermal expansion.

Another advantage of the invention is that physical parameter control can be built into the masterslice, allowing maximum freedom of personalization without concern for the physical parameter selected for control.

The foregoing and other objects, features and advantages of the invention will be apparent from the more particular description of the preferred embodiments of the invention, as illustrated in the accompanying drawings.

DESCRIPTION OF PREFERRED EMBODIMENTS OF THE INVENTION

Figure 1:
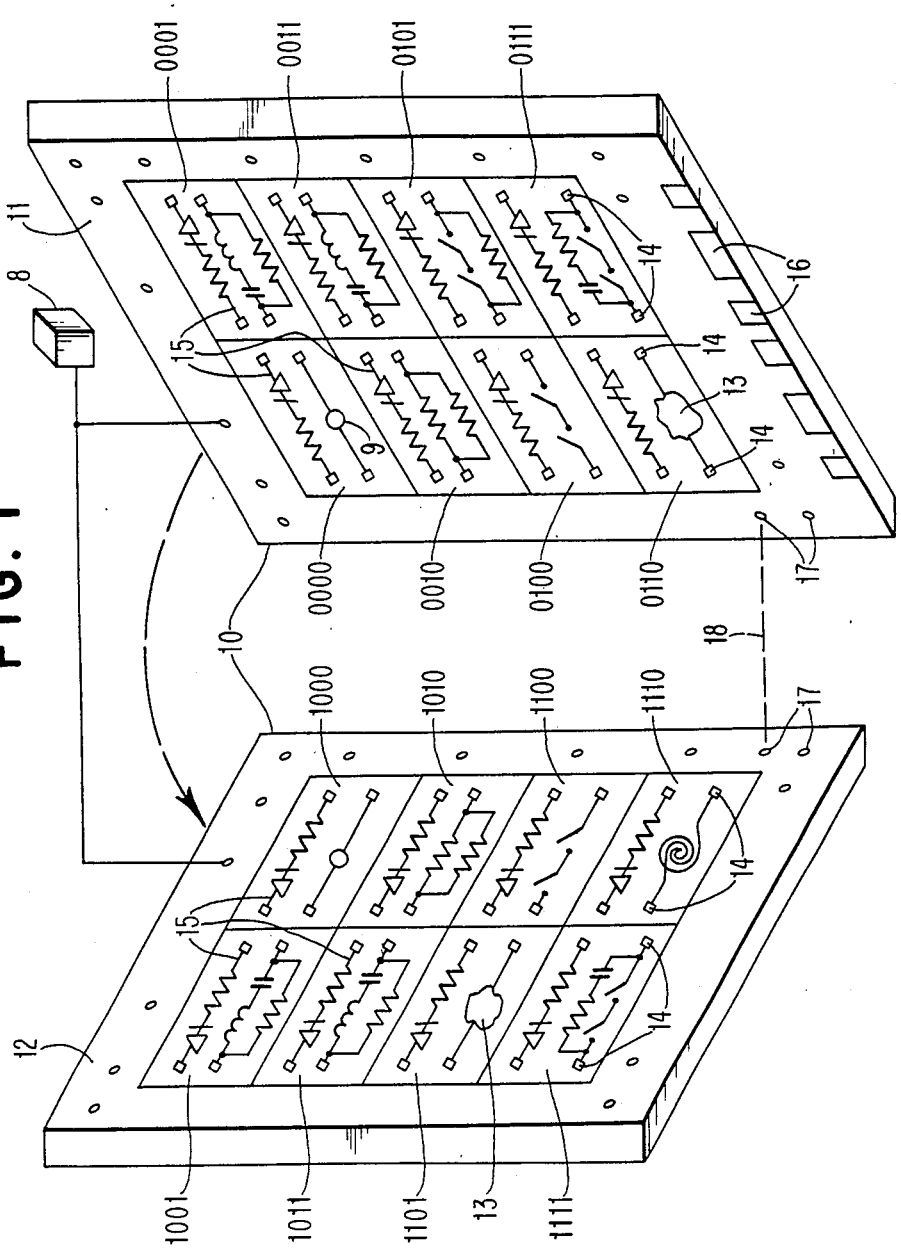
FIG. 1 is a semischematic butterfly presentation showing two mirror symmetric wafers opened to show representative complementary circuit islands with temperature balancing according to the invention.

FIGS. 1-7 show in abbreviated detail and schematically the inventive concept of opposed complementary wafers, with many interconnections, equipped to accomplish both island-to-island fault bypass and island-to-island physical parameter condition imbalance minimization through dynamic exercise allocation at circuit islands.

There are a number of physical parameters which lend themselves to balancing according to the invention, but temperature rise is the most powerful. With only a few remarks about other physical parameters, the physical parameter of temperature will be addressed, as the primary circuit exercise related parameter change and resulting failure mechanism to be balanced according to the invention. Temperature rise creates thermal gradients which affect $V_{eb}$ and also cause possibly destructive differential thermal expansion. The preferred embodiment thus concerns itself both with transitory and cumulative thermal effects. Other physical parameters which might be failure mechanisms include piezoelectric effects, capacitance, inductance, magnetization, radiation effects, strain and voltage. These and other physical parameters may be related to electronic exercise, as a cumulative or linear mechanical effect or otherwise, and may similarly be balanced or compensated island-to-island across wafers.

Opposed complementary wafers need not necessarily be mirror symmetric, but mirror symmetry is preferred. The concept of making use of mirror symmetry to facilitate the fabrication of multi-function wafers is expanded to the point where two wafers containing many islands of logic are joined together in a mirror symmetric fashion by many controlled collapse wafer connections. There are so many of the controlled collapse wafer connections, they are so small, and they may be so widely separated that they are subject to fracture as a function of thermomechanical stress. Unless the two wafers are closely matched thermally, primarily on a gross basis by wafer, but also from island to island within the wafer, thermomechanical stress occurs. Some wafer-to-wafer thermal matching takes place through convection and some wafer-to-wafer thermal matching takes place through thermal conduction at the interconnections, but these are not enough to match the cumulative effect of localized temperature rise. Such temperature rise can occur in a heavily exercised pattern of islands of an integrated circuit wafer.

Certain circuit islands may be lightly exercised during certain periods, and thereafter very heavily exercised during certain other periods. There is little possibility to predict the relative frequency of exercise of a circuit island, because exercise is a function of usage variation as well as fault bypass variation. Power gates can be used to depower faulty islands so they do not consume power unnecessarily. Similarly, power gates may be used to power up a faulty island, or a redundant good island, to mandate a thermal balance--even though the logical output from the island is to be disregarded. Semiconductor silicon is a good thermal conductor which is relatively homogenous and has relatively low coefficient of expansion, expanding linearly at about $3 \times 10^{-6}$ per degree Celsius. Nevertheless, cumulative thermochemical effects of such localized thermal build-ups can warp a wafer or cause fatigue which can shear delicate connections.

To prevent "hot" and "cold" spots on the wafers from causing thermomechanical stress, with possible resulting damage to the controlled collapse wafer connections, a physical condition balancing means is built into any such island which might be critical, hereafter designated "critical exercise island." Because each physical parameter balancing means is inexpensive, it usually is appropriate to consider each and every circuit island as a critical exercise island, and equip it with an associated physical parameter balancing means. The physical parameter balancing means typically includes: a physical parameter reporting means, such as a temperature sensor; a controlled gate responsive to the associated physical parameter reporting means; and a physical parameter transducing means such as a gated transistor resistor.

The temperature sensor can measure the temperature of the island by means of the emitter-base voltage $V_{eb}$ variation with temperature with a constant base-emitter current $I_{be}$, and control a gate which in turn controls the island temperature condition by gating an exercise demand to the related gated transducer. Where appropriate, differing physical parameter values, for example, $V_{eb}$, may be mandated at different islands as required for best overall performance of the entire system, rather than for best performance of circuits in the island itself. The gated transducer may be a resistor or power transistor, or more complex array of items which deal with the physical parameter under scrutiny. For the parameter of temperature, which has a related failure mechanism of differential thermal expansion, the physical parameter balancing means preferably comprises a temperature sensor, a sensor controlled gate and a gated resistor or transistor to provide heat during exercise. Circuit exercise, either of the operational circuit on the operational island, or of the physical parameter balancing circuit on its mirror twin island, heats up each island to nominal temperature, thus maintaining thermomechanical balance. The physical parameter balancing means mandates circuit exercise whenever ordinary circuit exercise fails to stress the island up to the nominal threshold for the parameter. The physical parameter balancing means (temperature) is quiescent whenever the logic exercise in the operational island places the island temperature within nominal levels as a result of the power dissipated within the island contrasted with heat dissipated to cooling mechanisms. While not normally required, the physical parameter balancing means may be connected to react to temperatures above nominal by taking drastic action, such as temporary pause or permanent shutdown.

The islands in the preferred embodiment are simply grid areas laid out as adjacent rectangles in the island defining a grid as shown in FIG. 1. More sophisticated island layouts may be envisaged, but the good thermal conductivity and thermomechanical homogeneity of silicon is such that an elegant rectangular grid of critical exercise islands satisfies the criteria for both fault bypass and condition balancing for the preferred embodiment. Physical parameter balancing means may conveniently be laid out with mirror grids identical to or slightly offset from each other and from the island defining grid. The grids must be similar as to the physical parameters selected for balancing. That is, opposed critical exercise islands must resemble each other physically, as "siblings," and preferably as mirror twins, insofar as the selected physical parameter is concerned.

In the preferred embodiment, every island is a critical exercise island. In practice, it might be known that a certain island is constantly exercised or for some other reason is immune from physical parameter problems and thus need not be equipped as a critical exercise island. That is, certain islands are known to be immune from compartmental physical parameter changes, or are known not to suffer failures as a result of such physical parameter changes, and therefore do not need to be equipped with physical parameters balancing means. Nevertheless, the preferred configuration is for each island to be equipped as a critical exercise island, with physical parameter balancing means.

The physical parameter balancing means may take many forms. One form is fully compartmental, with a sensor and a sensor-gated transducer located in or in close proximity to each island. Another form may use computation to simulate the sensor; the computation may be done locally or remotely. The transducer may also take many forms, ranging from a specialized transducer to the time-shared use of the existing circuitry as a physical parameter transducer. There are freedom-of-design advantages in having the physical parameter balancing means fully in place, that is, buried, prior to processing to prepare the logic devices of the masterslice or personalization; the physical parameter balancing means may in such case take a great variety of forms. There are, however, great processing advantages in making the physical parameter balancing means during the process steps required to make the operational logic devices of the masterslice or personalization. In the preferred embodiment the physical parameter balancing means are included in the masterslice prior to personalization.

Figure 2:
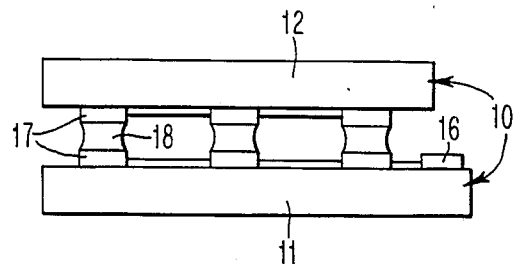
FIG. 2 is a semischematic elevation view of two opposed complementary wafers.

FIGS. 1 and 2 show computer means, which may be an off-wafer host computer 8 or an on-wafer computer 9, and opposed complementary mirror symmetrical wafer pair 10. Wafer pair 10 is made up of primary wafer 11 and secondary wafer 12, each divided into a number of islands designated by binary numbers 0000 to 0111 and 1000 to 1111, respectively. Any island may contain a fault 13 in an otherwise operational circuit between island circuit nodes 14. Islands 0110 and 1101 each are shown to contain a fault 13. Island 0110, in the primary wafer 11, cannot be used as an operational island; duty for the operation is switched by fault bypass techniques, controlled by computer means 8-9, to mirror twin island 1110, which thus assumes the duty as the operational island. Island 1101, in secondary wafer 12, is not operational, since its mirror twin island 0101 in primary wafer 11 is operational. Island 1101 is a redundant island; it contains a fault 13, but this does not matter because the operational duty has already been assigned to a good island, island 0101. By virtue of fault bypass connections, a full set of operational islands is available; each operational circuit contains some kind of good circuit between circuit nodes 14. A great number of good circuits are redundant; these are not operational insofar as their circuits are concerned, but they are physically present and subject to physical parameter effects. Each island is equipped with a physical parameter balancing means 15. All physical parameter balancing means are shown good in FIG. 1. The circuit module may be able to tolerate a few faulty physical parameter balancing means. It may be economically feasible to mandate good physical parameter balancing means, making and testing them so early that low yields may be tolerated economically. It may be possible to make the physical parameter balancing means so carefully or so well that acceptably high yields are available. A faulty physical parameter balancing means may be found early in processing and the wafer selected for a use in which it shares an island with an operational circuit known to maintain itself within nominal values for the physical parameter selected for balancing. The primary wafer 11 is equipped with off-wafer connection pads 16. Wafer 11 (FIGS. 1-2) is made slightly larger than wafer 12 so as to make the off-wafer I/O and power connections 16 accessible on the extension. When the two wafers 11 and 12 are joined, the exposed edges are sealed with a sealant so that contaminants in the cooling fluid cannot contact the active portion of the wafers.

The designations "primary" and "secondary" in this patent specification are made for ease of understanding the discussion; no hierarchy is implied. The actual choice of operational circuit island designation among good critical exercise islands may result in any desired pattern including random, checkerboard or other pattern selected for convenience or for balancing.

Wafers 11 and 12 are equipped with controlled collapse connection pads 17 which are connected by controlled collapse wafer connectors 18. Controlled collapse wafer connectors 18, during processing, form solder balls due to surface tension. The solder balls bridge the gaps between facing solder-wettable pads 17 to connect a primary wafer circuit and a secondary wafer circuit. The connection is both electrical and mechanical. The configuration of the connection is controlled by surface tension as the solder balls form pedestals 18 between pads 17. The controlled collapse wafer connector is not shown generally in FIG. 1, but shown as a dashed line for representative connections. The controlled collapse chip connection technique is well known in the integrated circuit industry, and often referred to as "C4." The hourglass pedestals result from inherent minimization of surface tension vectors for all the controlled collapse connections made at one time by solidification of reflow molten solder. The controlled collapse surface tension power is significant; high-speed microcinema sequences show wafers literally being snapped into position by the surface tension. Individually, however, the controlled collapse wafer connection has mechanical limitations, particularly the susceptibility to fatigue failure due to repeated lateral stress. Such lateral stress may be applied to a controlled collapse connector due to wafer bending, due to localized heating of a heavily exercised circuit island in one wafer, or due to cumulative expansion of a row of islands which are heated more than their mirror two row of sibling islands.

Figure 3:
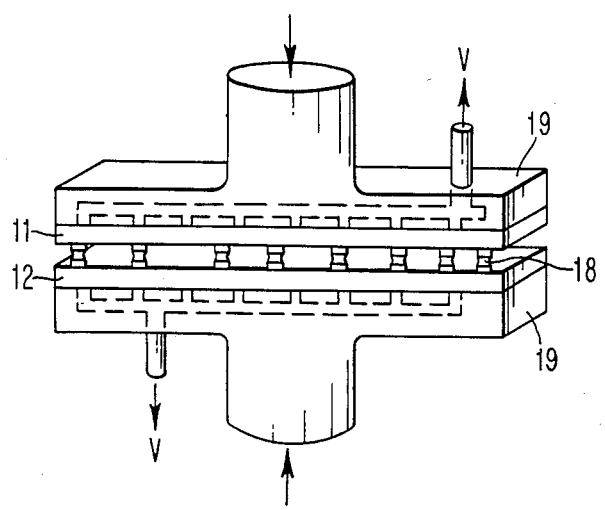
FIG. 3 is a semischematic diagram of process tooling for attaching complementary wafers with minimal thermal and mechanical stress gradients.

The process may take these potential lateral stress problems into account, and try to minimize them by achieving initial flatness. For example, as shown in FIG. 3, the two wafers in the preferred process are vacuum chucked against two flat hot plates 19. Hot plates 19 are positioned so as to align the controlled collapse wafer connections on each wafer 11-12, at least approximately, prior to bringing the wafers 11-12 together for reflowing the controlled collapse wafer connections 18. Circuit island exercise may be matched by thermal or computer feedback control of island selection so that the physical condition, most significantly thermal condition, is matched island to island and therefore wafer to wafer. Wafers 11 and 12 are arranged with opposed complementary islands 0000-0111 and 1000-1111 respectively as shown in FIG. 1. The islands may each contain a great number of transistors or other circuit devices; the items shown are not schematics of any particular circuit, but are hieroglyphics used to indicate the complementary (mirrorsymmetric) nature of opposed islands, regardless of circuit.

Circuits 1101 and 0111 are shown faulty in FIG. 1, with blemishes 13 graphically indicating the faults resulting from some unspecified failure mechanisms. Selection gates are used to select good circuits such as 0101 in preference to faulty circuit 1101, and 1110 in preferences to faulty circuit 0110, in accordance with well-known principles of fault bypass. Whether both islands are good, or even if one should be faulty, it is desired to balance physical conditions, principally thermal expansion. Thermomechanical stress may be inferred from temperature gradients. Other physical conditions may be measured directly by appropriate sensors, such as strain gages for mechanical strain. Monitoring information is fed back to the host computer which determines exercise patterns. Under certain conditions, the host 8 or on-wafer computer 9, or both in cooperation, may calculate temperature rise from exercise patterns impressed upon a selected circuit island, and provide feedback accordingly, from calculated physical parameter rather than from measured physical parameter. Alternatively, on-wafer computer 9 may serve as an exercise event counter for the island, and calculate by inference the temperature rise as a function of the count of exercise events, for example pulses passing a given point.

The circuits shown in FIG. 1 are shown without electronic detail, in hieroglyphic presentation merely indicating presence of a circuit between input/output nodes 14, each having solder-wettable pads 17 joined by controlled collapse connectors 18.

The physical parameter balancing means 15 comprises an included physical parameter reporting means which controls exercise of an included physical parameter transducing means. The devices making up the actual physical parameter balancing means are preferably similar to other devices in the integrated circuit, for ease in the production process, but any compatible set of devices is acceptable in principle. See, for example, Graeme, Designing with Operational Amplifiers, McGraw-Hill, NY 1977, Section 9.5, Electronic Thermometers pp. 254-257.

For the physical parameter of temperature, the physical parameter balancing means may in essence by a thermostatically controlled heater buried under or adjacent to each island. The thermal conductance of silicon is high; it is not necessary for the thermostat and heater to be remote from one another, although there should be enough isolation that the heater does not defraud its own thermostat. Physical parameter reporting means may be of at least the following three types: measuring type; threshold detection type; and calculation by inference type. The physical parameter reporting means is preferably located within the confines of the island, but may be located in margins between islands or elsewhere in the vicinity of the related island. Particularly for the calculation by inference type it may be possible to locate most or even all of the physical parameter reporting means remote from the island. Computer 8, for example, may have information sufficient to calculate occurrence of temperature rise in a particular island from the type of processing occurring; computer 8 may calculate temperature rise inferences from counts of exercise events taken by on-wafer computers 9 and sent to computer 8; other inferential techniques involving measurements, thresholds, and counts may become convenient as compartmentalized physical parameter effects become better understood. The physical parameter transducing means is preferably located within the confines of the island, but may be located in margins between islands or elsewhere in the vicinity of the related island, or may be remote aimable transducers such as lasers.

The only fixed rule is that the physical parameter reporting means and physical parameter transducing means, in cooperation with the included circuit devices in the critical exercise island, be capable of maintaining the associated critical exercise island within nominal limits for the selected parameter during ordinary operation.

With the physical condition reporting means being a temperature sensor, an appropriate physical parameter transducing means is a buried semiconductor resistor or buried semiconductor transistor gated by the temperature sensor for conduction when temperature is below nominal. Above nominal temperature may be detected by a second temperature sensor at a higher setting, with its high temperature range detection signal used as a control for transfer of duty to a sibling island or as a control for invoking emergency procedures.

FIG. 3 shows process tooling for connecting mirror symmetric wafers 11 and 12 by a number of controlled collapse wafer connections 18. The wafers are held on heated platens 19 by distributed vacuum ports which conform the wafers to the flat configuration of the faces of the platen toensure both planarity and parallelism. As the platens are heated, the solder reflows to form the connections 18.

A temperature sensitive parameter is $V_{eb}$. Because circuit exercise is unpredictable, and because the number of circuits to be driven may differ widely, both in parallel loading of a given circuit and in length of tandem chains, it is common to design $V_{eb}$ for worst case thermal gradient across the wafer. There is also a variation from batch to batch. Design for worst case can thus seriously degrade integrated circuit performance, particularly in the case of full-wafer integration.

Figure 4:
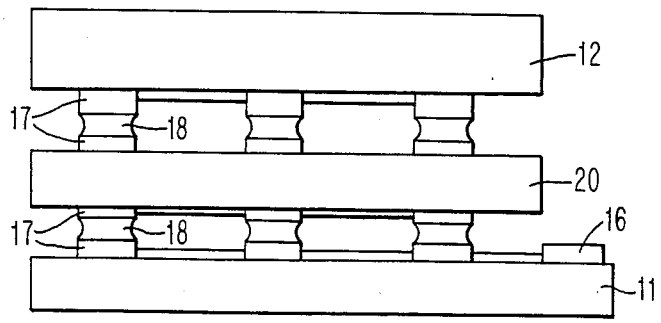
FIG. 4 is a semischematic elevation view of two opposed complementary mirror symmetric wafers connected by an interposer.
Figure 5:
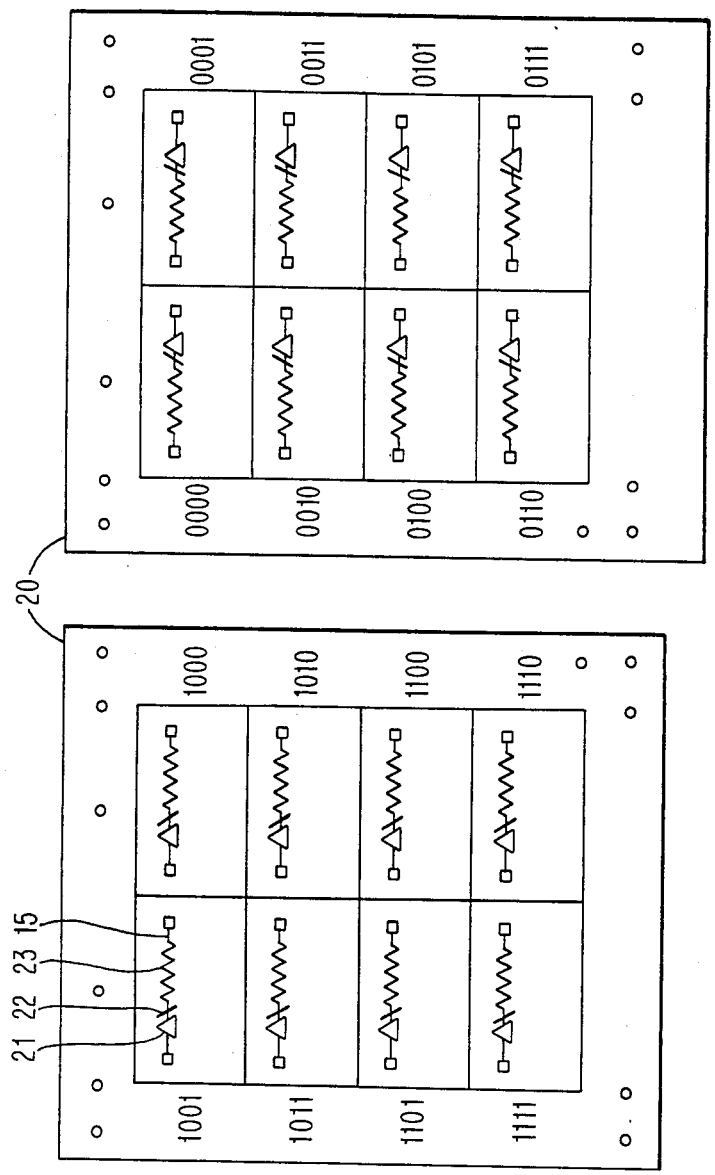
FIG. 5 is a plan view diagram of physical parameter control means on top and bottom of the interposer, corresponding to plan view diagrams of two mirror symmetrical wafers prior to production of integrated circuits, showing only the physical parameter balancing devices and the circuit island locations.
Figure 6:
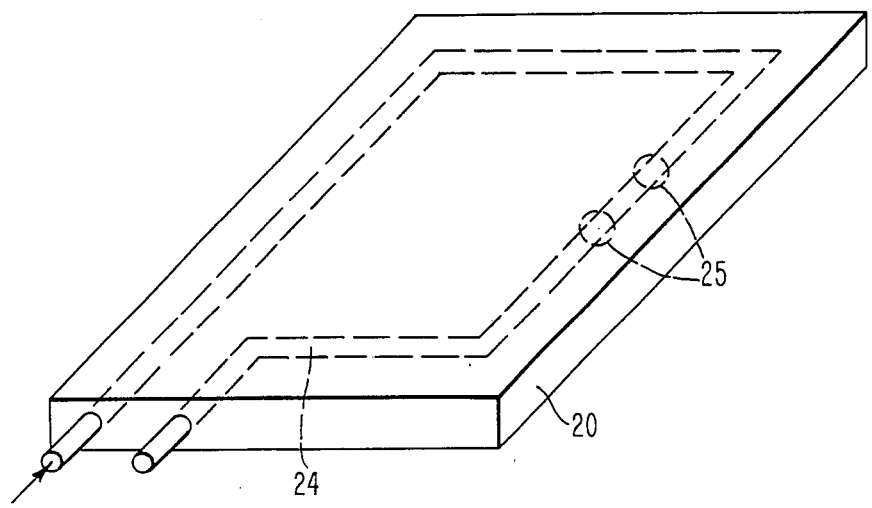
FIG. 6 is a semischematic isometric view of an interposer showing power distribution and cooling tunnels.

The mirror symmetric wafer technique for minimizing thermal gradients island-toisland optimizes the worst case by minimizing the thermal gradients island-to-island. It is also possible to optimize overall integrated circuit performance by adjusting island-to-island thermal gradients for best overall $V_{eb}$ performance of logic transistors —even though island-to-island thermal gradients might persist or individual islands might be temporarily over the nominal limit. Note that the $V_{eb}$ discussed earlier was that of the device used to measure the temperature of the silicon, whereas the $V_{eb}$ in this case in the emitter to base voltage of the logic transistors, not of the temperature sensing device FIGS. 4-6 shows an alternative embodiment, which distributes power to the wafers, without requiring three levels of metallization, through an interposer 20 placed between the two wafers 11 and 12. This interposer is made of silicon so as to match the thermal expansion coefficient of the wafers. The power distribution wiring is preferably a refractory metallurgy to handle the current, and is on both sides of the interposer in order to deliver power to both logic wafers. The interposer must supply via-connections for logic signals going from one side of the interposer to the other. This can be accomplished with Hughes' technique of applying a spot of aluminum to the silicon interposer and subjecting the interposer to an elevated temperature in conjunction with a thermal gradient which causes the aluminum spot to diffuse through the silicon, thus providing a via-connection from one side to the other.

It is possible also to fabricate gates on the interposer so as to provide the ability to disconnect a via-connection, i.e., open connection from one island on the primary wafer to the corresponding island on the other wafer. This is advantageous in overcoming the problem of a line on a wafer being shorted to ground or another signal line, thus making mirror twin islands, on complementary wafers, both inoperative. Such a fault, which defies easy fault bypass through transferring operational duty from twin to twin, is known as a killer fault.

FIG. 5 shows top and bottom of interposer 20, with physical parameter balancing means 15 arrayed in islands (0000–1111). The physical parameter balancing means, like those on circuit wafers 11 and 12 in FIG. 1, comprise parameter sensors 21, sensor controlled gates 22 and gate controlled transducers 23. FIG. 5 also serves as a layout diagram for the physical parameter balancing means of the wafers, operational logic eliminated for presentation clarity.

Figure 7:
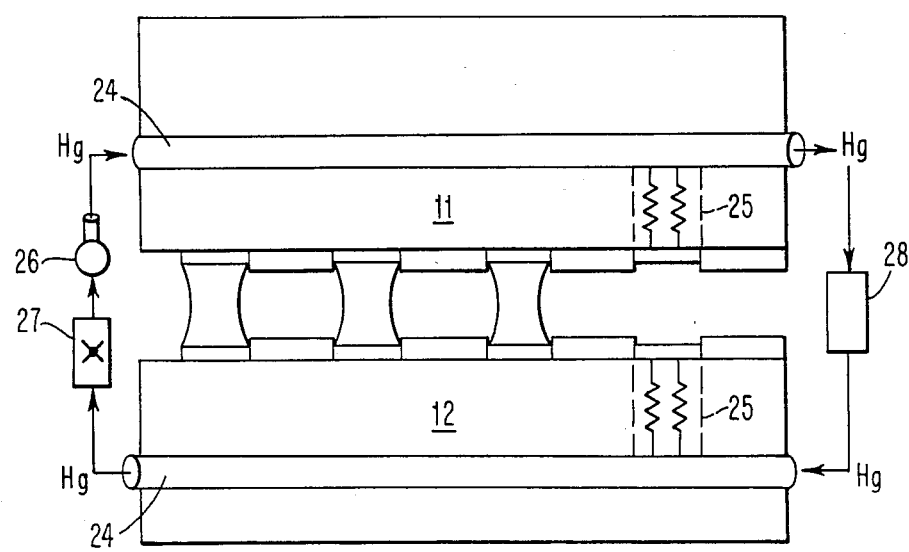
FIG. 7 is a semischematic elevation view of an opposed complementary wafer device with additional details of connection and cooling by pumped mercury.

FIGS. 6 and 7 show how power distribution channels 24 are embedded in interposer 20 (or in a wafer). There may be many interconnections between opposed complementary wafers; these may be conveniently made by controlled collapse connections at locations 25, using the following technique:

Start with two silicon wafers (single crystal); in one etch a groove in a pattern that matches the desired pattern for the power distribution line or lines. Deposit a refractive metal into the groove. Place the secod but slightly smaller silicon wafer over the wafer with the grooves and elevate the temperature while applying an electric field and pressure to the two wafers so as to reestablish the atomic bonds in the crystal lattice. The aluminum spots at the locations where vias are needed to connect to the power distribution metallurgy are diffused, by high temperature, down to the refractive metallurgy, thus providing a via to the power distribution channel 24.

Another approach to distributing power within the wafer, cooling the wafer with the metallization that supplies the power, is to use pumped mercury for both wafer powering and cooling. The grooves are created as for the refractive metal; the second wafer is applied, thus creating tunnels, and the vias 25 are deposited and diffused into the tunnels. After completion, and thereafter during operation, mercury is pumped through the tunnels. The mercury is at the same time used as a conductor and as a heat exchanger. Pump 26 and cooling radiator 27 as well as power supply 28 are shown schematically in FIG. 7. The power and cooling tunnels may be in an interposer 20 as shown in FIG. 4, or may be in the wafers 11–12 proper, so long as they are compatible with the circuit exercise islands on the wafers. Mercury (Hg) is an excellent conductor of both heat and electrical current, but it may be unacceptably corrosive and toxic. It is possible to use low melting metals such as copper to enhance the the refractive metal or to use low melting solder such as Woods metal as a liquid.

Hot and cold spots are minimized by controlling the exercise of one or both of primary and secondary circuitry, according to measured or calculated thermal gradient effects of circuit exercise. For example, island 0110 may be isolated from meaningful exercise because of fault, with all exercise allocated to island 1110. Island 1110 heats up and expands; absent physical parameter balancing, island 1110 would remain cool. There would be thermal expansion stress between wafers 11 and 12, putting strain on controlled collapse wafer connections from wafer 11 to wafer 12. Instead, electronically meaningless exercise is impressed on island 1110 to balance its temperature rise with that of its silbing island 0110. The electronic result is ignored; the thermal effect remains.

During operation, where mirror twin islands on both wafers are good, but only one of the mirror twin islands is operational, the physical parameter balancing means controls exercise to keep the mirror twin islands thermally balanced. Note that the mirror presentation of twin islands places then face to face in close proximity. During normal exercise, the convection of heat from primary to secondary wafer may be sufficient to keep the thermal gradient within the nominal range, and the physical parameter balancing means may remain dormant. When exercised lightly, neither primary island nor secondary island experiences significant thermal rise, but ther is no thermal expansion gradient since both islands have their physical parameter balancing devices activated. When exercised heavily, the operational island experiences thermal rise; the mirror twin island is kept at nominal temperature by its physical parameter balancing means.

As desired, physical parameter reporting means may include sensors which trigger at different temperatures, or at relative temperatures, so as to have multiple temperature rise plateaus or differential determinations. Strain gages or other sensors which directly measure mechanical aberrations may also be deployed, although at this time temperature sensing appears more stable and simple.

An alternative solution is to include exercise counters in the electronic circuits to count exercise events and infer thermal gradients rather than measure them. The exercise counters may control the switching of physical parameter balancing transducers in primary and secondary islands, either directly or differentially with respect to the counter on the sibling island.

Another alternative is to develop exercise counts externally in a monitoring computer and control the island gates accordingly.

Allocating operational or redundant status between good mirror twin islands taken it possible to use the operational circuit as the physical parameter transducing means. For example, when the control device determines that the operational island has reached a threshold temperature, a determination which may be measured or inferred from usage, operation may be redirected so that the mirror twin island, a good redundant circuit, takes over as operational island while its twin rests and cools as a redundant island. Where necessary for physical parameter balancing, both mirror twin islands may be gated for operation, with the output gates of one island turned off, to exercise both islands. This technique can be used even with faulty islands, but it is not preferred, since faults by their nature are difficult to monitor.

METHOD

The invention as embodied in single or opposed mirror symmetric wafers follows a method for operating am integrated circuit for optimum parameter invariance, regardless of wafer configuration. The essential steps are:

dividing the integrated circuit into exercise islands and critical exercise islands for fault bypass and physical parameter balancing;

providing a sibling critical exercise island, essentially a normally redundant duplication of circuitry of its related critical exervise island, for each critical exercise island, by a sibling exercise region, for fault bypass, thereby creating classes of exercise islands good operational, good redundant and bad;

reporting physical parameter values for each critical exercise island, whether good operational, good redundant or bad;

using physical parameter values for controlling redundant or redirected circuit exercise simultaneously, alternatively, or pausing, in both sibling critical exercise islands, both for directing appropriate allocation of duty to good operational critical exercise islands for dynamic operation and for causing appropriate physical parameter balancing operations for maintaining the selected physical parameter within nominal values.

The balancing of physical parameters is preferred when used with opposed mirror symmetric wafers, in which case the original step is:

dividing the integrated circuit into opposing mirror symmetric wafers with exercise islands and critical exercise islands for fault bypass and physical parameter balancing.

A variation of the method is to optimize overall integrated circuit performance by adjusting island-to-island thermal gradients for best overall $V_{eb}$ performance—even though island-to-island thermal gradients might persist or individual islands might be temporarily outside their individual nominal values. This is carried out by reporting the temperature values of appropriate critical exercise islands to the computer for review against algorithms for best overall performance and adjusting the nominal values of critical exercise islands individually.

The optimizing method extends to operating critical exercise islands for optimum system performance, possibly accepting degradation of performance of an individual island for the good of the overall computation, by including the steps of:

dividing the integrated circuit into critical exercise islands for physical parameter balancing;

assigning operational duty to critical exercise islands;

operating the integrated circuit, and during operation reporting physical parameter values of critical exercise islands;

reviewing physical parameter values against nominal values on an individual island basis;

reviewing situation criteria for acceptability of physical parameter values outside nominal values; and adjusting nominal values of physical parameters in response to situation cirteria.

An extreme example of this method, valid in on-line situations involving defense, health, industrial processing or transportation, might be to continue to use the integrated circuit module—even through overheated to the point of destructive failure of the module—if sacrifice of the module is an acceptable cost to continuing the computation.

Thus, while the invention has been described with reference to preferred embodiments thereof, with emphasis on eliminating thermomechanical stress by controlling the physical parameter temperature in critical exercise islands across the wafer it will be understood by those skilled in the art that controlling compartmentalized and cumulative effects of other physical parameters by means of the foregoing and other changes in form and details may be made without departing from the spirit and scope of the invention.

What is claimed is:

1. An integrated circuit wafer having physically identifiable electronic exercise islands, connected electronically by fault bypass connection means which redirects circuit exercise between sibling electronic exercise islands for fault bypass by assigning operational duty to selected good islands, in which compartmentalized and cumulative physical parameter change is a predictable result of electronic exercise of such related critical exercise islands comprising:

wafer means (11-12) having a plurality of critical exercise islands (0000-1111); and a plurality of physical parameter balancing means (15), each associated with a related one of said critical exercise islands (0000-1111), for maintaining within nominal range the related physical parameter within said critical exercise island.

2. An integrated circuit wafer according to claim 1 further comprising:

computer means (9) to control duty allocation of exercise islands as good operational islands, faulty islands, and good redundant islands as a function of physical parameter values reported by said physical parameter balancing means.

3. An integrated circuit wafer according to claim 1 wherein said physical parameter balancing means (15) comprises physical parameter reporting means and physical parameter transducing means controlled by said physical parameter reporting means for a predetermined physical parameter.

4. An integrated circuit wafer according to claim 3 wherein said physical parameter reporting means measures the predetermined physical parameter.

5. An integrated circuit wafer according to claim 3 wherein said physical parameter reporting means detects a threshold value for the predetermined physical parameter.

6. An integrated circuit wafer according to claim 3 wherein said physical parameter reporting means inferentially calculates the value of the predetermined physical parameter as a function of a count of exercise events.

7. An integrated circuit wafer according to claim 3 wherein the predetermined physical parameter is selected from piezoelectric effects, capacitance, inductance, magnetism, radiation, strain, temperature and voltage.

8. An integrated circuit wafer according to claim 3 wherein said wafer comprises a buried channel (25) for carrying electrical current and for heat transfer by means of a material which is liquid and both electrical and heat conductive at operating temperatures.

9. An integrated circuit wafer according to claim 3 further comprising computer means (8) to control said physical parameter transducing means for a respective critical exercise island as a function of physical parameter values reported by said physical parameter reporting means associated with the respective critical exercise island.

10. An integrated circuit wafer according to claim 9 wherein said computer means (8) comprises on-wafer computer means (9) physically positioned within a respective critical exercise island to count exercise events for calculating inferentially the physical parameter values local to the respective critical exercise island.

11. An opposed complementary wafer circuit module, having physically identifiable related electronic exercise islands connected electronically by crossover connection means, including crossover gating means, for redirecting circuit exercise betweem sibling electronic exercise islands for fault bypass, whereby a physical parameter change is a predictable result of unbalanced electronic exercise of such related critical exercise islands comprising:
- a primary wafer (11) having a plurality of critical exercise islands (0000-1111);
- a secondary wafer (12) having a plurality of critical exercise islands (1000-1111); and
- a plurality of physical parameter balancing means (15), each associated with a related one of said critical exercise islands on said primary and secondary wafer for maintaining within nominal values a predetermined physical parameter within said associated critical exercise island.

12. An opposed complementary wafer circuit module according to claim 11 further comprising an extension on at least one said primary or secondary wafer, said extension having off-wafer connection pads (16).

13. An opposed complementary wafer circuit module according to claim 11
wherein said primary (11) and secondary (12) wafers comprise a buried channel (25) for carrying electrical current and for heat transfer by means of a material which is liquid and both electrical and heat conductive at operating temperatures.

14. An opposed complementary wafer circuit module according to claim 13
wherein the crossover connection means is pumped mercury.

15. An opposed complementary wafer circuit module according to claim 11,
wherein said physical parameter balancing means comprises physical parameter reporting means (21) and physical parameter transducing means (22-23) controlled by said physical parameter determining means (21).

16. An opposed complementary wafer circuit module according to claim 15,
wherein said physical parameter reporting means is a temperature sensor.

17. An opposed complimentary wafer circuit module according to claim 15, wherein said physical parameter reporting means senses a physical parameter selected from piezoelectric effect, capacitance, inductance, magnetism, radiation, strain and temperature.

18. An opposed complementary wafer circuit module according to claim 17 further comprising an interposer (20) positioned intermediate and primary wafer (11) and said secondary wafer (12), said interposer (20) having islands complementary to related islands on said primary and secondary wafers, and having for critical exercise islands physical parameter balancing means, whereby a predetermined physical parameter is balanced across the module.

19. An opposed complementary wafer circuit module according to claim 18
wherein said interposter (20) comprises a buried channel (25) for cayying electrical current and for heat transfer by means of a material which is liquid and both electrical and heat conductive at operating temperatures.

20. An opposed complementary wafer circuit module configured for optimum temperature invariance between a critical exercise island in a primary wafer and a related critical exercise island in a secondary wafer having crossover connections means, including crossover gating means, for redirecting circuit exercise among related critical exercise islands so that sibling critical exercise islands are alternatively operational facing faulty, or operational facing good redundant whereby circuit exercise tends to cause condition related physical parameter mismatch phenomena between related critical exercise islands comprising:
- threshold condition reporting means associated with operational critical exercise islands for developing a crossover decision signal indicative of mismatch physical parameter between facing sibling critical exercise islands; and
- crossover gating control decision means, responsive to said threshold condition reporting means for redirecting circuit exercise among sibling critical exercise islands, so that facing sibling critical exercise islands which are both good are each alternatively good operational or good redundant, depending upon threshold conditions of the physical parameter.

21. An opposed complementary wafer circuit module configured for optimum temperature invariance between a critical exercise island in a primary wafer and a sibling critical exercise island in a secondary wafer, in which circuit exercise tends to cause temperature rise and related mismatch phenomena between said primary and said secondary wafers comprising:
- a first physical parameter reporting means associated with said critical exercise island;
- a second physical parameter reporting means, associated with said sibling critical exercise island;
- crossover gating means connecting a critical exercise island on said primary wafer with a physically related critical exercise island on said secondary wafer; and
- crossover gating control decision means, connected to said first and second physical parameter reporting means, for redirecting operational designation between good operational and good redundant critical exercise islands and control exercise of both good operational and good redundant critical exercise islands for maintaining the temperature within nominal values.

22. A method for operating an integrated circuit for optimum parameter invarience comprising the steps of:
- dividing the integrated circuit into critical exercise islands for physical parameter balancing;
- assigning operational duty to critical exercise islands;
- operating the integrated circuit, and during operation reporting physical parameter values of critical exercise islands; and
- altering circuit exercise within individual critical exercise islands as a function of reported values of physical parameters.

23. A method for operating an integrated circuit for optimum system performance comprising the steps of:
- dividing the integrated circuit into critical exercise islands for physical parameter balancing;
- assigning operational duty to critical exercise islands;
- operating the integrated circuit, and during operation reporting physical parameter values of critical exercise islands;

reviewing physical parameter values against nominal values on an individual island basis;

reviewing situation criteria for acceptability of physical parameter values outside nominal values; and adjusting nominal values of physical parameters in response to situation criteria.

24. A method for operating an integrated circuit for optimum parameter invariance comprising the steps of:

dividing the integrated circuit into exercise islands and critical islands for fault bypass and physical parameter balancing;

assigning operational duty to critical exercise islands for purposes of fault bypass;

operating the integrated circuit, and during operation reporting physical parameter values of critical exercise islands; and altering circuit exercise within individual critical exercise islands as a function of reported values of physical parameters.

25. A method for operating an integrated circuit for optimum temperature invariance comprising the steps of:

dividing the integrated circuit into exercise islands and critical exercise islands;

providing a sibling critical exercise island, essentially a redundant duplication of circuitry of its related critical exercise island, for each critical exercise island;

providing temperature reporting means for each critical exercise island; and providing gating means, responsive to said temperature reporting means, for controlling circuit exercise simultaneously in both sibling critical exercise islands, and for alternatively diverting circuit exercise from good operational critical exercise island to its sibling good redundant exercise island, and back, in accordance with temperatures reported by said temperature reporting means.

26. An integrated circuit masterslice having operational logic devices requiring personalization prior to becoming an integrated circuit wafer, having a plurality of physically identifiable electronic exercise islands, connectable electronically by fault bypass connection means which redirects circuit exercise between sibling electronic exercise islands for fault bypass by assigning operational duty to selected good islands, in which compartmentalized and cumulative physical parameter change is a predictable result of electronic exercise of such related critical exercise islands comprising a plurality of physical parameter balancing means associated with the plurality of exercise islands, said physical parameter balancing means (15) including physical parameter reporting means and physical parameter transducing means controlled by said physical parameter reporting means for a predetermined physical parameter.

* * * * *